United States Patent [19]

Ohashi et al.

[11] Patent Number: 4,617,831

[45] Date of Patent: Oct. 21, 1986

[54] PUSH BUTTON TYPE TUNER

[75] Inventors: Tamaki Ohashi, Tokyo; Tsunefusa Suzuki, Wanabishi; Kaoru Nakada, Saitama; Nobuya Hoshi, Tokyo; Hisao Fujimura, Kanagawa; Hiromitu Ui, Tokyo, all of Japan

[73] Assignee: Nihon Technical Kabushiki Kaisha, Tokyo, Japan

[21] Appl. No.: 642,953

[22] Filed: Aug. 21, 1984

[51] Int. Cl.⁴ .............................................. H03J 5/12
[52] U.S. Cl. ...................................... 74/10.33; 334/7
[58] Field of Search ............................ 74/10.33; 334/7

[56] References Cited

U.S. PATENT DOCUMENTS

| | | | |
|---|---|---|---|
| 3,646,821 | 3/1972 | Clark | 334/7 X |
| 3,722,299 | 3/1973 | Knight et al. | 74/10.33 |
| 4,010,652 | 3/1977 | Sugimoto et al. | 334/7 X |
| 4,041,784 | 8/1977 | Ohashi | 334/7 X |
| 4,079,631 | 3/1978 | Chaki | 334/7 X |
| 4,143,555 | 3/1979 | Ohashi | 74/10.33 |
| 4,237,740 | 12/1980 | Chaki | 334/7 X |

FOREIGN PATENT DOCUMENTS

| | | | |
|---|---|---|---|
| 55-27719 | 2/1980 | Japan | 334/7 |
| 59-12615 | 1/1984 | Japan | 334/7 |

Primary Examiner—Allan D. Herrmann
Attorney, Agent, or Firm—Robert E. Burns; Emmanuel J. Lobato; Bruce L. Adams

[57] ABSTRACT

An improved push button type tuner is disclosed which assures that an operator can selectively tune to one of two preset radio frequencies merely by actuating a single push button. The push button type tuner includes a plurality of channel selecting mechanisms each of which comprises an actuating shaft with a push button fixedly secured thereto and two channel selecting shafts disposed by both the sides of the actuating shaft. The actuating shaft and the channel selecting shafts are supported so as to move between the fore inoperative position and the rear operative position. The actuating shaft includes a main gear and a shifting lever which performs shifting operation in such a manner that the pair of channel selecting shafts are alternately displaced to the rear operative position at every time when a cycle of foreward and rearward movements of the actuating shaft between the fore inoperative position and the rear operative position is achieved. Each of the channel selecting shafts includes a follower gear adapted to mesh with the main gear when the it is displaced to the rear operative position and a channel selecting dog mounted thereon to move in the axial direction as it is rotated. The channel selecting dog serves to select a frequency of the variable tuning device as the channel selecting shaft is displaced in the axial direction.

16 Claims, 21 Drawing Figures

FIG. 9
FIG. 10
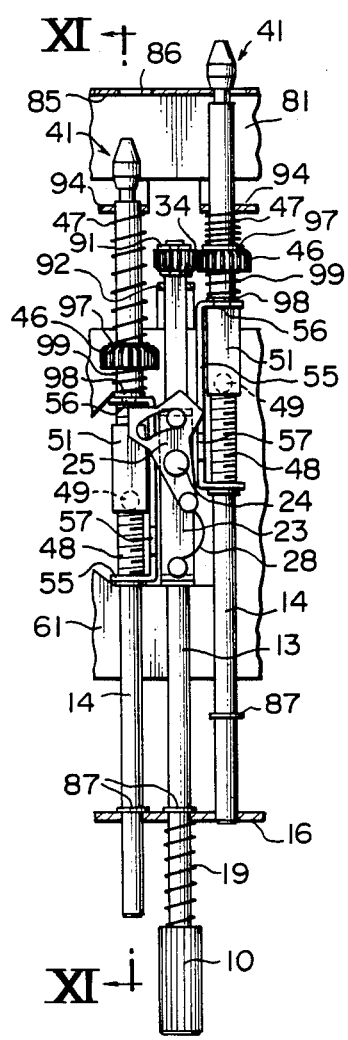
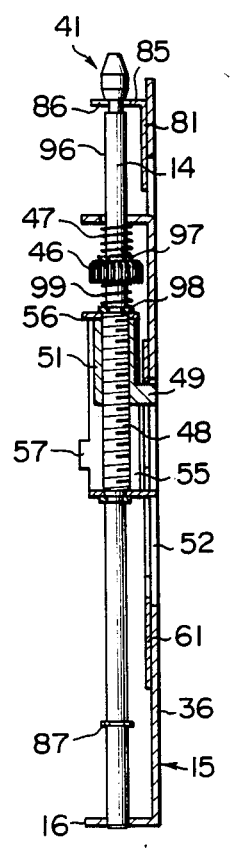

FIG. 11
FIG. 12
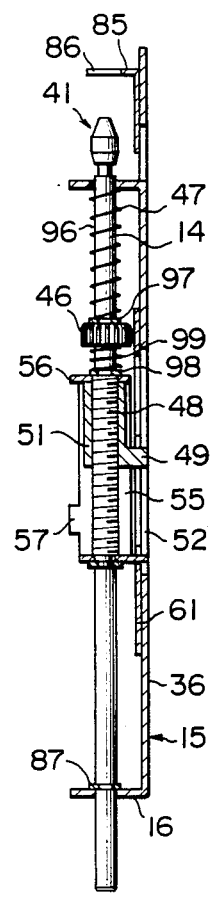
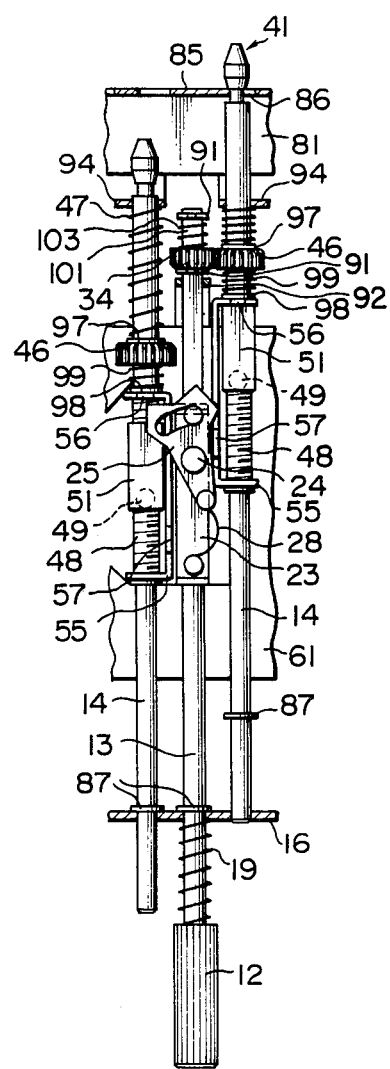

PUSH BUTTON TYPE TUNER

BACKGROUND OF THE INVENTION

1. Field of the Invention

The present invention relates to a push button type tuner usable for a radio receiver and more particularly to an improved push button type tuner which assures that an operator can selectively tune to one of two preset radio frequencies merely by actuating a single push button.

2. Description of the Prior Art

A widely known conventional push button type tuner is constructed such that a preset radio frequency is allocated to each of a plurality of push buttons, and an operator tunes to a required radio frequency by actuating a corresponding push button. In the conventional push button type tuner as constructed in the above-described manner, only one radio channel can be usually selected by one push button. Thus, to select one of many predetermined radio channels there is necessity for arranging an increased number of push buttons corresponding to the number of radio channels. This causes a tuner to be designed and constructed in larger dimensions. Therefore, when a smaller tuner is employed, it is unavoidably inhibitive to handle a lot of channels therewith.

In view of the drawback of the conventional tuner as mentioned above, there was made a proposal as to a tuner of the above-mentioned type as disclosed in Japanese Utility Model Publication No. 57-43391 which was filed by the same assignee as that of the present invention. The proposed tuner is constructed such that a pair of channel selecting members are disposed with a push button being located at the middle therebetween whereby one of two different radio channels can be selected by actuating the push button so that an operator can pre-set a number of radio channels corresponds to two times the number of push buttons. Specifically, the conventional tuner includes a plurality of channel selecting mechanisms each of which includes a push button, a pair of channel selecting members disposed by both the sides of the push button and a shifting member for selectively inhibiting the one channel selecting member from being displaced by manual operation. Channel shifting is achieved, for instance, to AM band or FM band in dependence on the position determined by the shifting member and thereby an operator can tune to one of two different frequency bands by operating one of the pair of channel selecting shafts disposed by both the sides of the push button. However, the conventional tuner requires that an operator handle the shifting member at every time when he selects either of AM and FM bands. Further, in the case when channel selection is performed for 10 channels by operating 5 push buttons, he achieves channel selection only for a combination of 5 AM bands. Accordingly, he cannot do so for other combination, for instance, of 6 AM bands and 4 FM bands.

SUMMARY OF THE INVENTION

Thus, the present invention has been made with the foregoing background and shortcomings of prior art push button tuners in mind.

It is an object of the present invention to provide an improved push button type tuner which assures that an operator selects one of many radio channels each having a different frequency and which can be designed and constructed in smaller dimensions.

It is another object of the present invention to provide an improved push button type tuner which assures that two channel selecting members are selectively actuated by means of a single actuating member with a push button fixedly secured thereto, and selection of a channel selecting member to be actuated is achieved merely by the pushing operation of the actuating member.

To accomplish the above objects there is proposed according to the present invention a push button type tuner including supporting means, tuning means mounted on the supporting means to generate a tuned frequency, the tuning means being adapted to move to the position corresponding to the frequency, and a plurality of presettable channel selecting mechanisms for selectively displacing the tuning means to the position corresponding to a frequency specified for each of the channel selecting mechanisms, wherein the improvement consists in that each of the channel selecting mechanisms includes a rotatable actuating member which is displaceable between the fore inoperative position and the rear operative position relative to the supporting means, the actuating member being normally urged toward the fore inoperative position and including a main rotatable portion and a push button which serves also as a rotary knob, and the push button being fixedly secured to the foremost end of the actuating member. The actuating member is operatively associated with a pair of rotatable channel selecting members which are displaceable between the fore inoperative position and the rear operative position, the control selecting members being so mounted on the supporting means that they are normally urged toward the fore inoperative position and including a follower rotatable portion which is selectively engaged to the main rotatable portion to rotate with the latter, each of the channel selecting members having a longitudinally extending threaded portion formed on a part of the surface thereof so that a channel selecting dog is threadably mounted on the threaded portion, the channel selecting dog being displaceable in the forward and rearward directions as the channel selecting member rotates. An engagement mechanism is mounted on the actuating member so as to engage the actuating member to the channel selecting members so that the latter are alternately displaced toward the rear operative position of the actuating member at every time when a cycle of forward and rearward movements of the actuating member between the fore inoperative position and the rear operative position is achieved. The tuning means includes an actuating plate adapted to be engaged to the channel selecting dog on the channel selecting member which is located at the rear operative position so that the tuning means is adjusted by the actuating plate; and the tuner further includes a locking member which serves to allow transmission of rotation of the main rotatable portion to the follower rotatable portion when one of the channel selecting members is located at the rear operative position and unlock the one channel selecting member which has assumed the rear operative position from the locked state when the other channel selecting member reaches the rear operative position.

According to the invention the push button type tuner is operated such that, for instance, two different receiving band channels are stored by a pair of channel selecting members in a certain channel selecting mechanism and another two different receiving band channels are stored by a pair of channel selecting members in other channel selecting mechanism. Thus, the tuner of the invention can be used as a multi-channel tuner which allows channel selection from many receiving bands.

In a preferred embodiment of the invention, the diameter of the main rotatable portion is made smaller than that of the follower rotatable portion whereby a required frequency is determined very finely. Since channel selection is achieved by forward and rearward movements of the push button, the actuating member and the channel selecting members in the same direction, operation of channel selection is performed very smoothly with the minimized occurrence of mechanical damage.

Other objects, features and advantages of the invention will becomes more clearly apparent from a reading of the following description when taken in conjunction with the accompanying drawings.

BRIEF DESCRIPTION OF THE DRAWINGS

The accompanying drawings will be briefly described below.

FIG. 9 is a fragmental transverse sectional view of the push button type tuner in FIG. 8, particularly illustrating a set of channel selecting mechanism.

FIG. 10 is a vertical sectional view of the push button type tuner taken in line X—X in FIG. 8.

FIG. 11 is a vertical sectional view of the push button type tuner taken in line XI—XI in FIG. 9.

FIG. 12 is a fragmental transverse sectional view of a push button type tuner in accordance with the third embodiment of the invention, particularly illustrating a set of channel selecting mechanism.

DESCRIPTION OF THE PREFERRED EMBODIMENTS

Figure 1:
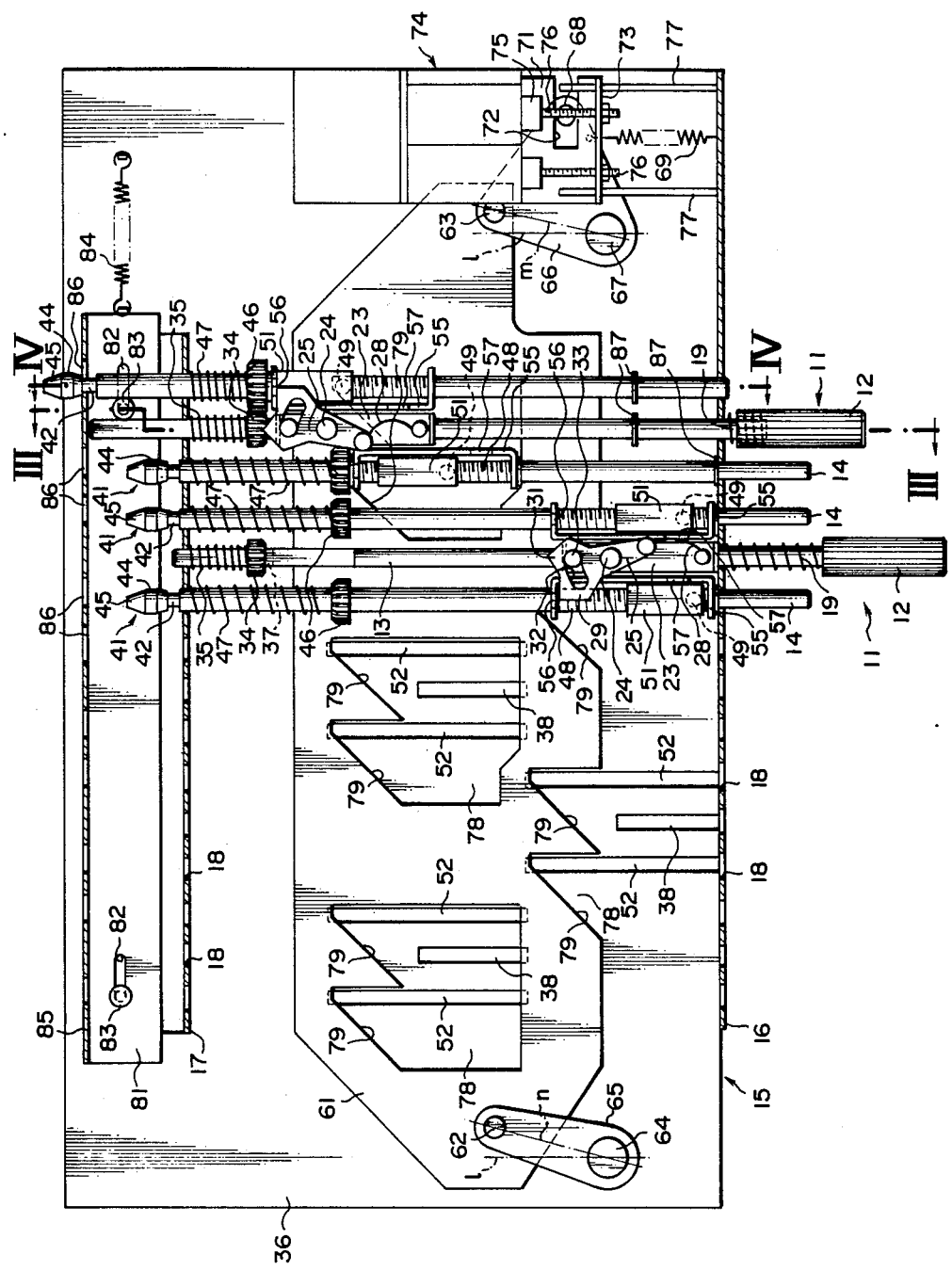
FIG. 1 is a transverse sectional view of a push button tuner in accordance with the first embodiment of the invention.

Now, the present invention will be described in a greater detail hereunder with reference to the accompanying drawings which illustrate preferred embodiments thereof. It should be noted that the same or similar parts or components throughout the drawings are identified by the same reference numerals and their repeated description is omitted for the purpose of simplification.

First, description will be made below as to a push button type tuner in accordance with the first embodiment of the invention with reference to FIGS. 1 to 7. In this embodiment, arrangement is made such that an operator can select one of 10 channels with the aid of five channel selecting mechanisms with a push button fitted thereto respectively. However, since each of the channel selecting mechanisms is designed and constructed in the same manner, description and illustration will be limited only to two channel selecting mechanisms whose function is different from one another and the remaining three channel selecting mechanism will not be illustrated and described any more for the purpose of simplification. Each of the channel selecting mechanisms is generally identified by reference numeral 11. The channel selecting mechanism 11 includes an actuating shaft 13 with a cylindrical push button 12 fitted to the foremost end thereof and two channel selecting shafts 14 located on both the lefthand and righthand sides relative to the actuating shafts 13 as seen from the above. In the following description, the area where the push button 12 is located is called the fore side and the area where no push button is provided is called the rear side. As is apparent from the drawings, the fore side of the actuating shaft 13 and the channel selecting shafts 14 is inserted through holes 18 on the fore upright standing portion 16 of a support plate 15 to freely move in the longitudinal direction, whereas the rear side of the same is inserted through holes 18 on the rear upright standing portion 17 of the same to freely move in the longitudinal direction.

Between the push button 12 of the actuating shaft 13 and the fore upright standing portion 16 is disposed a coil spring 19 which serves to normally displace the actuating shaft 13 in the forward direction under the effect of the resilient force of the coil spring 19. Further, the actuating shaft 13 is provided with bent pieces 21 and 22 at the position predetermined in the area between both the fore and rear upright standing portions 16 and 17 and each of the bent pieces 21 and 22 is bent downwardly. A support member 23 is disposed above the actuating shaft 13 while extending between the bent pieces 21 and 23 and the actuating shaft 13 is inserted through holes of the bent pieces 21 and 22 to carry the support member 23. On the upper surface of the support member 23 is disposed a pivotal shaft 24 which stands upright therefrom, and a shifting lever 25 is turnably fitted to the pivotal shaft 24 at the middle part thereof. A pin 26 is fixedly secured to the fore end of the shifting lever 25 while projecting upwardly therefrom, whereas a pin 27 is fixedly secured to the fore end of the support member 23 while projecting upwardly therefrom. A wire spring 28 is bridged between both the pins 26 and 27 so as to allow the shifting lever 25 to turn in both the lefthand and righthand directions as seen in FIG. 1.

To form tongues 29 and 31 which extend away from one another in a V-shaped pattern, the shifting lever 25 is designed to have an increased width at the rear end part thereof. In the widened rear end part of the shifting lever 25 is formed an arched slit 32 which extends between both the tongues 29 and 31, and a pin 33 standing upright from the support member 23 is fitted into the slit 32. Thus, the extent of turning movement of the shifting lever 25 is limited by a combination of the pin 33 and the slit 32. The rear end part 39 of the actuating shaft 13 is partially machined in the axial direction by a milling operation so as to have the non-circular cross-sectional configuration and a main gear 34 is axially displaceably fitted to this shaft portion having the non-circular cross-sectional configuration. As is apparent from the drawings, a coil spring 35 adapted to normally thrust the main gear 34 in the forward direction under the effect of its resilient force is spirally fitted onto the actuating shaft 13 in the area located between the main shaft 34 and the rear upright standing portion 17. Due to the arrangement of the coil spring 35, the main gear 34 is normally brought in pressure contact with a stopper 37 which stands upright on the base plate 36 by punching operation. The lower end part of the bent piece 22 constituting the support member 23 is fitted into the elongated guide hole 38 on the bottom plate 36 of the support plate 15 so that the support member 23 is slidably displaced in the longitudinal direction along the elongated guide hole 38.

Each of the channel selecting shafts 14 adapted to cooperate with the actuating shaft 13 is designed and constructed in the same manner. Thus, description will be made only as to one of channel selecting shafts 14 and the same parts or components constituting the other channel selecting shaft 14 are represented by same reference numerals but their repeated description will be omitted for the purpose of simplification. Specifically, the channel selecting shaft 14 includes a cam shaft 41 at the rear end thereof which is projected in the rearward direction in coaxial relation. The cam shaft 41 comprises a neck portion 42 located adjacent to the channel selecting shaft 14 and having a diameter smaller than that of the latter, an inclined portion 43 of which diameter increases gradually in the rearward direction away from the neck portion 42, a cylindrical portion 44 extending from the rear end of the inclined portion 43 in the rearward direction and having the same diameter as that of the channel selecting shaft 14, and an inclined portion 45 of which diameter decreases gradually in the rearward direction away from the cylindrical portion 44. A follower gear 46 is fixedly secured to the channel selecting shaft 14 at the position located at a predetermined distance from the rear upright standing portion 17. Further, a coil spring 47 is spirally disposed on the channel selecting shaft 14 in the area defined between the follower gear 46 and the rear upright standing portion 17 so that the channel selecting shaft 14 is normally thrusted in the forward direction under the effect of resilient force of the coil spring 47. The follower gear 46 is adapted to come in meshing engagement to the main gear 34 when it is displaced in the rearward direction against resilient force of the coil spring 47. It should be noted that the follower gear 46 has a diameter larger than that of the main gear 34.

The channel selecting shaft 14 is formed with male thread 48 on the outer surface in the area located between the follower gear 46 and the fore upright standing portion 16, and a channel selecting dog 51 with a storing projection 49 projecting downwardly therefrom is threadably fitted onto the male thread 48. The storing projection 49 is inserted into the elongated guide hole 52 extending in the axial direction of the channel selecting shaft 14 on the support plate 15. Thus, as the channel selecting shaft 14 is rotated, the channel selecting dog 51 is caused to move on the channel selecting shaft 14 in the forward and rearward directions. A stopper 55 is fixedly attached to the channel selecting shaft 14 in such a manner that its bent pieces 53 and 54 are located at both the fore and rear ends of the male thread 48. To assure that the stopper 55 is held immovably in the axial direction of the channel selecting shaft 14 but it is rotatable about the latter, fixing washers or the like means are employed for the stopper 55.

Further, the stopper 55 is provided with an engagement piece 56 at the position located on the upper middle part of the bent piece 53. The engagement piece 56 is adapted to come in engagement with the fore edge of the one tongue 29 or 31 on the shifting lever 25 and thereby allow the channel selecting shaft 14 to move in the forward direction when the actuating shaft 13 is to move in the forward direction toward the rear operative position. The stopper 55 is provided with a projection 57 at the position located on the upper surface of the fore end part thereof. This projection 57 is adapted to come in engagement with the rear edge of the one tongue 29 or 30 on the shifting lever 25 to shift the latter to the other side.

Next, description will be made below as to the operational relation between the actuating shaft 13 and the pair of channel selecting shafts 14 located on both the sides thereof. Now, it is assumed that for instance, the fore edge of the tongue 29 on the shifting lever 25 is ready to come in engagement with the engagement piece 56 of the stopper 55 on the lefthand channel selecting shaft 14. When the push button 12 is manually pushed in the rearward direction, the lefthand channel selecting shaft 14 is caused to move together with the actuating shaft 13 in the rearward direction while the tongue 29 is kept in engagement with the engagement piece 56. At this moment the main gear 34 comes in pressure contact with the stopper 37 under the effect of resilient force of the coil spring 35 whereby it is held at the constant position. This causes the follower gear 46 on the lefthand channel selecting shaft 14, which has been displaced rearwardly relative to the main gear 34, to mesh with the latter. The lefthand channel selecting shaft 14 which has been displaced in the rearward direction in that way is immovably held by means of a locking plate which will be described later. While the locked state is maintained, the push button 12 is released and thereby the actuating shaft 13 is restored to the initial position with the aid of the return spring 19.

During return movement, the rear edge of the tongue 29 on the shifting lever 25 abuts against the projection 57 on the lefthand channel selecting shaft 14 whereby the shifting lever 25 is turned in the clockwise direction to come in operative connection with the righthand channel selecting shaft 14. Thus, the fore edge of the other tongue 31 on the shifting lever 25 is ready to abut against the engagement piece 53 of the stopper 55 on the righthand channel selecting shaft 14. Namely, at every time when the actuating shaft 13 performs a cycle of forward and rearward movements, the shifting lever 25 is alternately turned in both the clockwise and counterclockwise directions on abutment against the projection 57 to come in operative connection with the lefthand or righthand channel selecting shaft 14.

On the bottom plate 36 of the support plate 15 is provided an actuating plate 61 which extends in the direction at a right angle relative to the axis of the actuating shaft 13. The actuating plate 61 has pivotal shafts 62 and 63 which stand upright therefrom at the position located at both the ends as seen in the longitudinal direction of the actuating plate 61, that is, at the lefthand and righthand ends as seen in FIG. 1. The lefthand pivotal shaft 62 is pivotally connected to one end of a turning bar 65 whose other end is pivotally connected to a pivotal shaft 64 standing upright on the base plate 36, whereas the righthand pivotal shaft 63 is pivotally connected to one corner of a rotary plate 66 having a substantially triangular configuration. Another corner of the rotary plate 66 is pivotally connected to a pivotal shaft 67 standing upright on the bottom plate 36, and the remaining corner of the same has a pin 68 fixedly secured thereto. At this corner with the pin 68 standing upright on the rotary plate 66 is disposed one end of a coil spring 69 whose other end is anchored at the fore upright standing portion 16. The actuating plate 61 is supported to move in the leftward and rightward directions relative to the bottom plate 36 and it is normally urged in the rightward direction under the effect of the resilient force of the spring 69. The pin 68 is fitted into a cutout 72 on a sliding plate 71 located above the pin 68, the cutout 72 extending in the transverse direction relative to the sliding plate 71.

This sliding plate 71 has an upright standing portion 73 at the fore end thereof and the foremost end of an armature shaft 76 of a telescopic armature 75 constituting a variable tuning device 74 is fixedly connected to the upright standing portion 73. Since the variable tuning device 74 is a conventional known device of the type selectively determining a required frequency by adjusting the position of the telescopic armature 75, detailed description thereof is unnecessary. To displaceably hold the upright standing portion 73 of the sliding plate 71 there are provided two support rods 77 of which one end is fixedly secured the fore upright standing portion 16 of the support plate 15. Thus, as the rotary plate 66 is rotated about the pivotal shaft 69 which serves as a fulcrum, the sliding plate 71 is caused to move in the forward or rearward direction with the aid of the pin 68 whereby the position of the armature 75 can be adjusted as required.

In the illustrated embodiment the actuating plate 61 is formed with ten cutouts 78 corresponding to the number of channel selecting dogs 51, each of the cutouts 78 being adapted to receive therein the storing projection 49 of the channel selecting dog 51. As is apparent from FIG. 1, the cutouts 78 are formed at the central part of the actuating plate 61 for the channel selecting mechanism 11 located at the right end and those located alternately as seen from the right end, whereas the cutouts 78 are formed at the fore end part of the actuating plate 61 for the channel selecting mechanism 11 located at the second position as counted from the right end and those located alternatively as seen from the second one. Each of the cutouts 78 has an inclined edge 79 extending in the same inclined direction at the rear end part thereof.

A locking plate 81 extending in the direction at a right angle relative to the axis of the actuating shaft 13 is disposed at the position located rearwardly of the rear upright standing portion 18 on the bottom plate 35 of the support plate 15. The locking plate 81 is formed with two elongated holes 82 extending in the longitudinal direction at both the end parts thereof, and a pin 83 standing upright on the bottom plate 36 is fitted into each of the elongated holes 82 whereby the extent of movement of the locking plate 81 in both the rightward and leftward directions is limited by the length of the elongated holes 82. Further, the locking plate is operatively connected to a coil spring 84 whose right end is anchored at the bottom plate 36 so that the locking plate is normally urged in the rightward direction as seen in FIG. 1 under the effect of the resilient force of the coil spring 84. The locking plate 81 has an upright standing portion 85 along the rear end edge and the same number of locking holes 86 as that of the channel selecting shafts 14 are formed on the upright standing portion 85, each of the locking holes 86 being dimensioned so as to allow the cam shaft 41 of the channel selecting shaft 14 to pass therethrough.

When the channel selecting shaft 14 is displaced in the rearward direction, the rear inclined portion 45 of the cam shaft 41 is first fitted into one of the locking holes 86 and thereby the locking plate 81 is displaced in the leftward direction as seen in FIG. 1 against the resilient force of the coil spring 84 whereby the cylindrical portion 44, the fore inclined portion 43 and the neck portion 42 are successively fitted into the hole 86. When the neck portion 42 is fitted into the hole 86, the locking plate 81 is displaced in the rightward direction as seen in FIG. 1 under the effect of the resilient force of the coil spring 84 and thereby the locking hole 86 is located in the boundary area between the neck portion 42 and the fore inclined portion 43, resulting in the channel selecting shaft 14 being locked in the rear operative position. Once it is locked, the follower gear 46 on it is brought in meshing engagement with the main gear 34 on the actuating shaft 13.

In this embodiment, to reduce the width of the tuner, that is, the dimensions as measured in the leftward and rightward directions in FIG. 1, arrangement is made in the above-described manner such that one cutout 78 is located at the position offset from that of the adjacent one in the forward and rearward directions. Accordingly, it should of course be understood that the male thread 48 on one channel selecting mechanism is located at the position offset from that of the adjacent one also in the foward and rearward directions. In view of the fact as mentioned above, the actuating shaft 13 and the channel selecting shafts 14 on the righthand channel selecting mechanism 11 as seen in FIG. 1 are provided with washers 87 at the fore end part thereof which serve as stopper when they are caused to return to their initial position. On the other hand, with respect to the lefthand channel selecting mechanism 11 as seen in FIG. 1, there is no necessity for preparing washers because the bent pieces 54 on the stoppers 55 abut against the fore upright standing portion 16 when the channel selecting shafts 14 assume their fore position. In this case the bent pieces 54 on the stoppers 55 are utilized as washers. If the tuner may be designed in longer width, cutouts 78 may be arranged in line in the transverse direction.

Next, operation of the tuner in accordance with the first embodiment of the invention will be described below.

When the push button 12 of the actuating shaft 13 on the channel selecting mechanism 11 located at the right end as seen in FIG. 1 is manually pushed, the actuating shaft 13 and the channel selecting shaft 14 located rightwardly of the former are displaced together because the righthand tongue 31 of the shifting lever 24 abuts against the engagement piece 56. As the channel selecting shaft 14 is displaced further in the rearward direction, the neck portion 42 on the cam shaft 41 is brought in locking engagement to the locking hole 86 of the locking plate 81 whereby the channel selecting shaft 14 is kept in the locked state at the rear operative position. At this moment the main gear 34 on the actuating shaft 13 is caused to mesh with the follower gear 46 on the channel selecting shaft 14. When the push button 12 is released from the pushed state while the above-mentioned operative state is maintained, the actuating shaft 13 is displaced in the forward direction together with the support member 23 under the effect of resilient force of the return spring 19 but the main gear 34 is still maintained at the predetermined position where it meshes with the follower gear 46. During return movement, the fore edge of the tongue 31 on the shifting lever 25 abuts against the projection 57 of the stopper 55 on the righthand channel selecting shaft 14 and thereby the the shifting lever 25 is caused to turn in the counterclockwise direction as seen in FIG. 1, resulting in the operative state as illustrated in FIG. 2 being attained.

Figure 2:
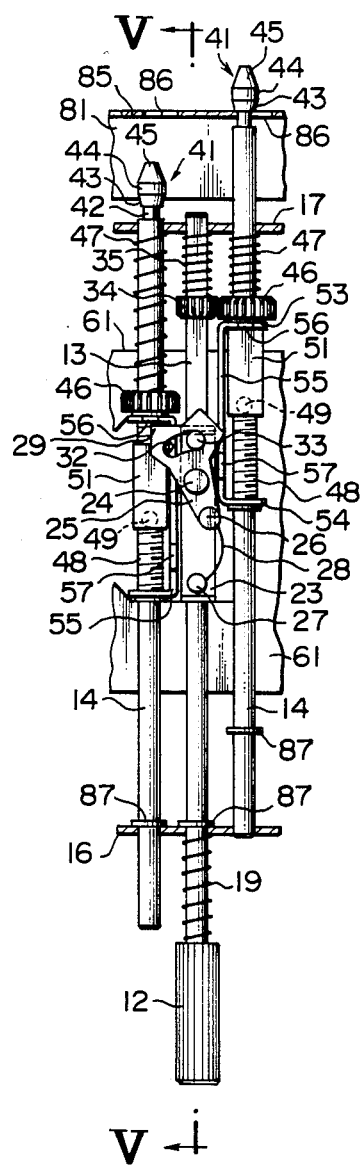
FIG. 2 is a fragmental transverse sectional view of the push button tuner in FIG. 1, particularly illustrating a set of channel selecting mechanism.
Figure 3:
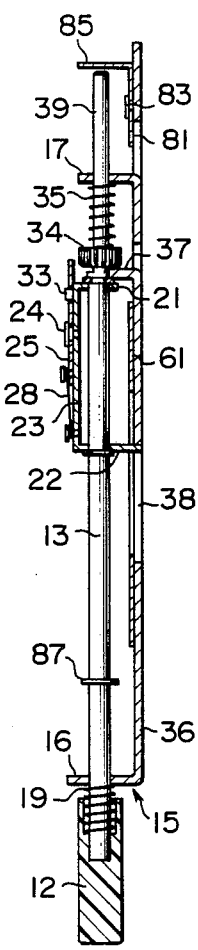
FIG. 3 is a vertical sectional view of the push button type tuner taken in line III—III in FIG. 1.
Figure 4:
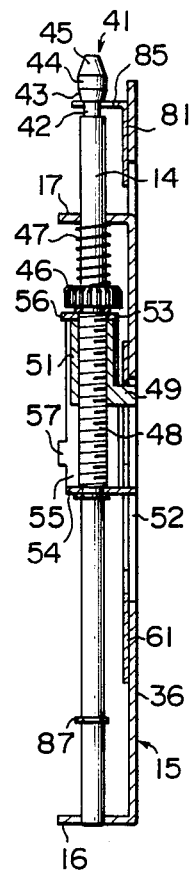
FIG. 4 is a vertical sectional view of the push button type tuner taken in line IV—IV in FIG. 1.
Figure 5:
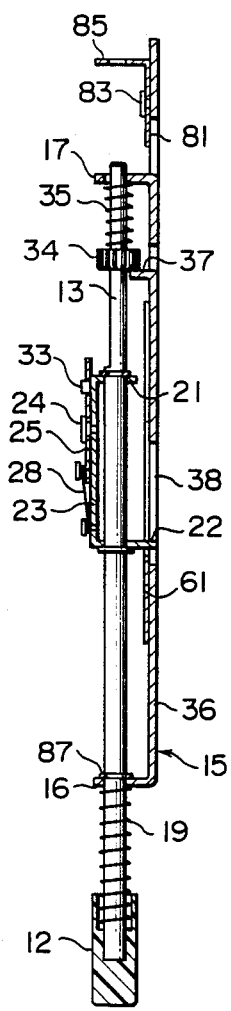
FIG. 5 is a vertical sectional view of the push button type tuner taken in line V—V in FIG. 2.

When the push button 12 is rotated while the operative state as illustrated in FIG. 2 is maintained, rotation of the push button 12 is transmitted to the righthand channel selecting shaft 14 via a combination of the main gear 34 having a smaller diameter and the follower gear 46 having a larger diameter. Because of difference in diameter between both the gears 34 and 46, the channel selecting shaft 14 is rotated at a reduced rotational speed and thereby the channel selecting dog 51 is displaced along the male thread 48 on the channel selecting shaft 14 in the axial direction of the latter at a reduced linear speed. As the channel selecting dog 51 is displaced further, the storing projection 49 projecting downwardly therefrom is caused to come in pressure contact with the inclined edge 79 of the actuating plate 61 whereby the latter is displaced corresponding to a stroke of movement of the channel selecting dog 51. Movement of the actuating plate 61 causes the rotary plate 66 to be rotated about the pivotal shaft 67 whereby the position of the pin 68 changes and the sliding plate 71 is displaced in the forward and rearward directions. Thus, the position of the armature 75 varies and a required radio channel is selectively obtained. The thus selected channel is kept unchanged as long as the actuating shaft 13 is not operated. This means that the selected channel is stored.

After a required channel is stored in the righthand channel selecting shaft 14 by displacing the channel selecting dog 51 in that way, the push button 12 on the actuating shaft 13 is pushed again while the operative state as illustrated in FIG. 2 is maintained. Thus, the lefthand tongue 29 on the shifting lever 25 abuts against the engagement piece 56 of the stopper 55 on the lefthand channel selecting shaft 14 and thereby the actuating shaft 13 is displaced rearwardly together with the lefthand channel selecting shaft 14. As it is displaced rearwardly further, the rear inclined portion 45 of the cam shaft 41 is fitted into the locking hole 86 on the locking plate 81 and thereafter the latter is displaced in the leftward direction as seen in FIG. 2 against the resilient force of the spring 84. This transverse movement of the locking plate 81 allows the neck portion 42 of the cam shaft 41 on the righthand channel selecting shaft 14 which has been locked in the rear operative position to be released from the locking hole 86 whereby the righthand channel selecting shaft 14 resumes its initial position under the effect of resilient force of the return spring 47. On completion of return movement of the righthand channel selecting shaft 14, the neck portion 42 of the cam shaft 41 on the foremost end of the lefthand channel selecting shaft 14 is brought in locking engagement to the locking hole 86 on the locking plate 81 whereby the lefthand channel selecting shaft 14 is kept in the locked state at the rear operative position. Once it is kept locked, the follower gear 46 on the lefthand channel selecting shaft 14 is caused to mesh with the main gear 34. It should be noted that meshing engagement therebetween is still maintained even after the push button 12 is released from the pushed state. When the push button 12 is rotated while the above-mentioned operative state is maintained, the lefthand channel selecting shaft 14 is rotated by way of meshing engagement between the main gear 34 and the lefthand follower gear 46, and the channel selecting dog 51 on the lefthand channel selecting shaft 14 is displaced in the forward and rearward directions. Thus, the actuating plate 61 is displaced in the transverse direction in the same manner as described above so as to adjust the position of the armature 75 so that a required channel is selectively determined and stored.

After a required channel is selectively determined and stored on each of the channel selecting shafts 14 arranged on the support frame 15, a push button 12 required by an operator is manually pushed so that the actuating shaft 13 is displaced rearwardly. Subsequently, one of the pair of channel selecting shafts 14 disposed on both the sides of the actuating shaft 13 to selectively cooperate with the latter is displaced rearwardly together with it. Since the storing projection 49 on the selectively determined channel selecting shaft 14 is kept in abutment against the inclined edge 79 in the actuating plate 61 under the effect of the resilient force of, the spring 69, a radio channel stored by the channel selecting dog 51 can be reproduced with the aid of two functions of transverse movement of the actuating plate 61 and adjustment of the variable tuning device 74.

In the above-described embodiment the main gear 34 is mounted on the actuating shaft 13 so as to slidably move on the rear part 39 of the latter having a non-circular cross-sectional configuration in the axial direction and moreover rotate together with the actuating shaft 13 while it is normally urged to come in pressure contact with the stopper 37 under the effect of the resilient force of the spring 35. If the follower gear 46 fails to mesh with the main gear for any reason, the latter is forcibly displaced in the rearward direction against the resilient force of the spring 35 but rearward displacement of the main gear 34 is interrupted when the push button 12 is rotated whereby the main gear 34 is brought in meshing engagement with the follower gear 46.

Figure 7:
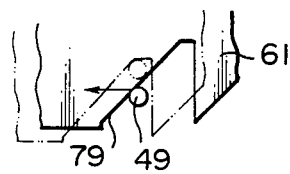

Further, in the normal operative state where each of the storing projections 49 on the channel selecting dogs 51 is not brought in pressure contact with an inclined edge 79 on the actuating plate 61, the latter is displaced rightwardly as seen in FIG. 1. At this moment both the turning bar 65 and the rotary plate 66 are kept inclined in accordance with the direction of inclination of the inclined edge 79. This is attributable to the following fact. Namely, if the turning bar 65 and the rotary plate 66 are so located that a line n extending between both the pivotal shafts 62 and 64 and a line m extending between both the pivotal shafts 63 and 67 are identical to a line l extending through the pivotal shafts 64 and 67 in paralled with the axis of the actuating shaft 13, a force component v produced at the position where the storing projection 49, for instance, on the righthand channel selecting dog 51, comes in contact with the inclined edge 79 while it moves forwardly becomes effective for displacing the actuating plate 61 in the leftward direction as seen in FIG. 7 whereby the position of the actuating plate 61 is shifted from that as identified by solid lines to that as identified by phantom lines in the drawing. This means that the actuating plate 61 is caused to move forwardly, that is, toward the fore upright standing portion 16 in such a manner as to inhibit forward movement of the storing projection 49. As a result, rotation of the follower gear 46 and rearward movement of the channel selecting shaft 14 are achieved only with much difficulties.

Figure 6:
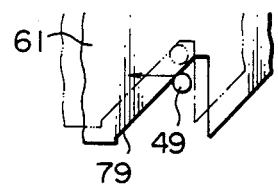
FIGS. 6 and 7 are a fragmental schematic view of the push button type tuner, particularly illustrating operation of the tuner as illustrated in FIG. 1.

In view of the foregoing drawback, arrangement is made in accordance with the illustrated emboidiment such that the position of the actuating plate 61 is shifted from that as identified by solid lines to that as identified by phantom lines in FIG. 6 in such a mammer that it is displaced in the transverse direction while it moves rearwardly as the storing projection 49 moves rearwardly. Therefore, according to the embodiment of the invention, rotation of the follower gear 46 and rearward displacement of the channel selecting shaft 14 are achieved easily and smoothly.

Figure 8:
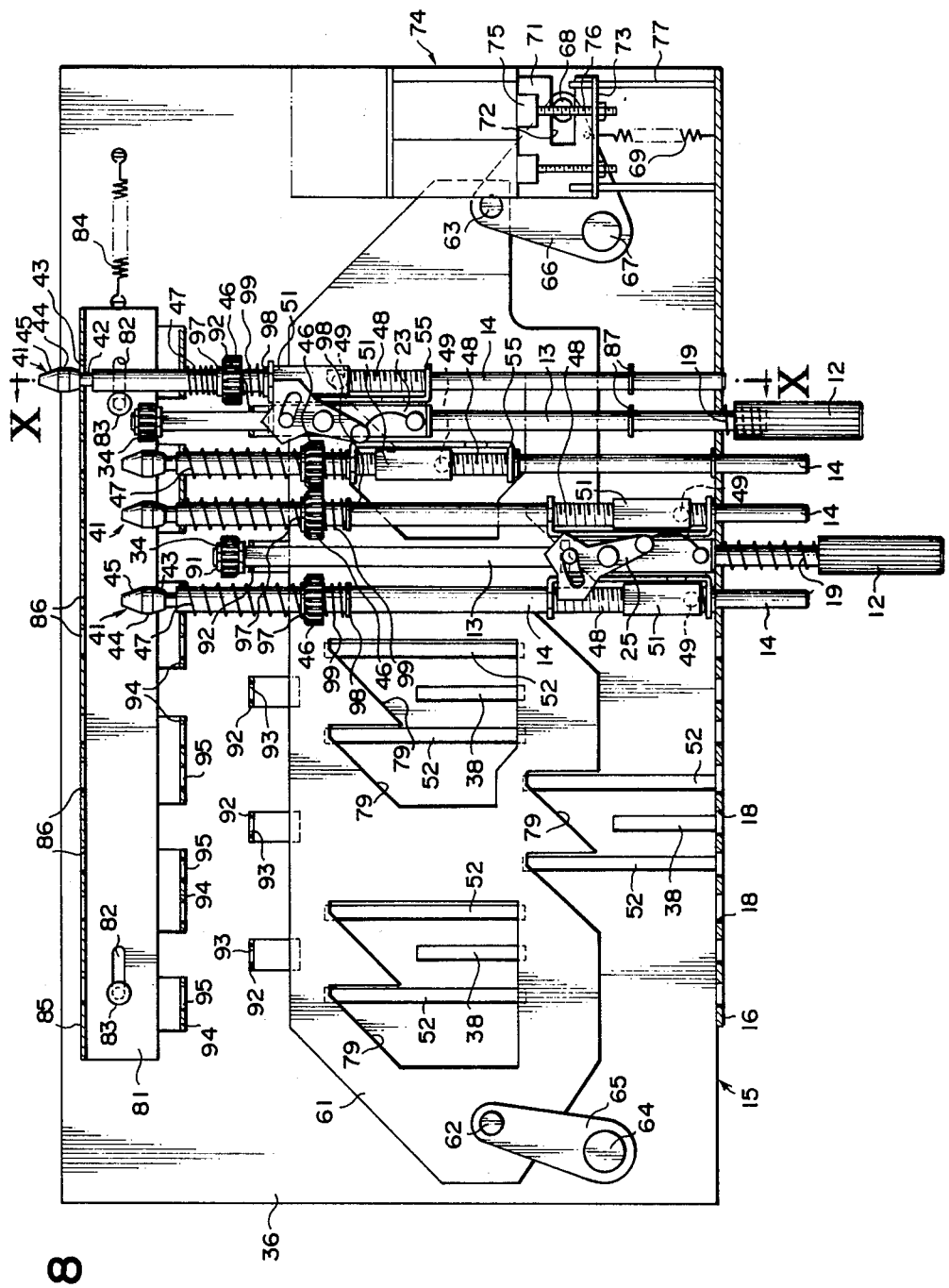
FIG. 8 is a transverse sectional view of a push button type tuner in accordance with the second embodiment of the invention.

Next, descritpion will be made below as to a push button type tuner in accordance with the second embodiment of the invention with reference to FIGS. 8 to 11. This embodiment consists in that actuating shafts and channel selecting shafts are designed and constructed in a modified manner from the foregoing embodiment. As is apparent from the drawings, the rear end part of each of the actuating shafts 13 is dimensioned shorter than that of those in the first embodiment, and a main gear 34 is fixedly mounted on the rearmost end of the actuating shaft 13 with the aid of washers 91 located on both the fore and rear sides thereof. A part of the actuating shaft 13 located forwardly of the main gear 34 is supported by inserting it through a hole 93 on the support piece 92 which is a projection from the bottom plate 36 prepared by a punching operation. Each of the support pieces 92 is provided opposite to the corresponding actuating shaft 13. On the other hand, the rear end part of each of the channel selecting shafts 14 is supported by means of a rear upright standing portion 94 which is adapted to support a pair of channel selecting shafts 14, one of them being one channel selecting shaft on a channel selecting mechanism and the other one being other channel selecting shaft on the next channel selecting meachanism, for instance, in the embodiment as illustrated in FIG. 8, one of them being a lefthand channel selecting shaft 14 on the right end channel selecting mechanism 11 as measured from the right end one. Specifically, the channel selecting shafts 14 are supported in the same manner as in the foregoing embodiment by inserting them through holes 95 on the rear upright standing portion 94. Two rear upright standing portions 94 located adjacent to one another have an open space therebetween in order to assure that rearward movement of the main gear 34 is not inhibited any longer when the actuating shaft 13 is displaced rearwardly.

As illustrated in FIGS. 10 and 11, the rear end part of the channel selecting shafts 14 is designed to have a non-circular cross-sectional configuration, and a follower gear 46 is mounted on the non-circular cross-sectional portion 96 so as to slidably move in the axial direction. A first washer 97 is fixedly secured to the fore end of the non-circular cross-sectional portion 96, and a second washer 98 is fixedly secured to the rear part of the channel selection shaft 14 at the position spaced away from the first washer 97. A coil spring 99 is disposed on the channel selecting shaft 14 in the area as defined between the first and second washers 97 and 98 so as to normally thrust the follower gear 46 toward the first washer 97 under the effect of the resilient force of the coil spring 99. It should be noted that the follower gear 46 is so mounted on the channel selecting shaft 14 that is slidably moves in the axial direction of the channel selecting shaft 14 and moreover it is rotated together with the latter.

If the main gear 34 fails to mesh with the follower gear 46 for any reason when the push button 12 is pushed rearwardly, meshing engagement therebetween is achieved by axial movement of the follower gear 46 in the same manner as in the first embodiment. Specifically, during return movement of the actuating shaft 13, the follower gear 46 is displaced forwardly against the resilient force of the spring 99 when gear teeth on the main gear 34 abut against those on the follower gear 46 and, thereafter, the actuating shaft 13 is rotated while the abovementioned operative state is maintained. Thus, abutment of gear teeth therebetween is cancelled during rotation of the actuating shaft 13 and the follower gear 46 is displaced rearwardly under the effect of the resilient force of the spring 99 until it meshes with the main gear 34.

Next, description will be made below as to a push button type tuner in accordance with the third embodiment of the invention with reference to FIG. 12. This embodiment is modified from the second embodiment in such a manner that the main gear 34 is also movable in the axial direction. Specifically, the gear end part 101 of the actuating shaft 13 is designed to have a non-circular cross-sectional configuration by a milling operation, and a main gear 34 is mounted thereon so as to slidably move in the axial direction and moreover rotate together with the actuating shaft 13. A fixing washer 91 is fixedly secured to the rearmost end of the noncircular cross-sectional portion 101 and a coil spring 103 is disposed in the area defined between the washer 91 and the main gear 34. According to the third embodiment of the invention, both the main gear 34 and the follower gear 46 are movable relative to one another and thereby the former meshes with the latter without fail by rotating the actuating shaft 13, when gear teeth on the former abut against those on the latter.

Figure 13:
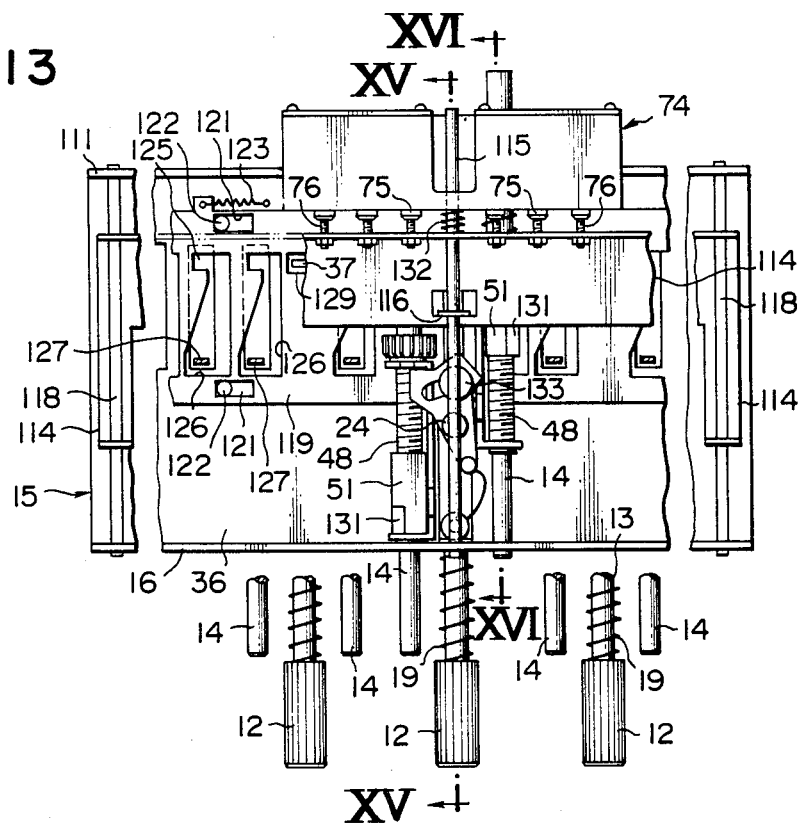
FIG. 13 is a plan view of a push button type tuner in accordance with the fourth embodiment of the invention, shown in the partially cut-off state.
Figure 14:
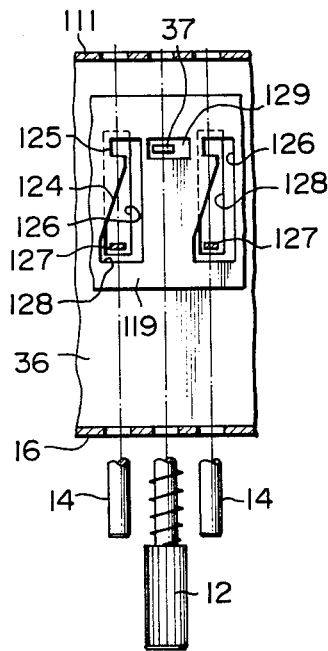
FIG. 14 is a fragmental plan view of the push button type tuner in FIG. 13.
Figure 15:
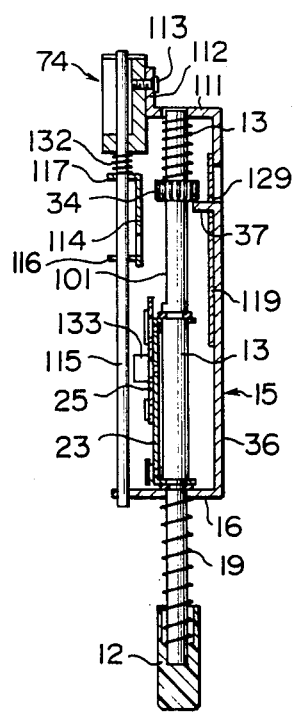
FIG. 15 is a vertical sectional view of the push button type tuner taken in line XV—XV in FIG. 13.
Figure 16:
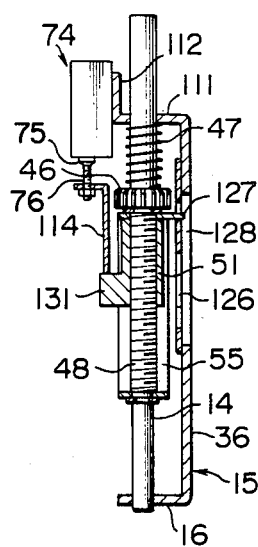
FIG. 16 is a vertical sectional view of the push button type tuner taken in line XVI—XVI in FIG. 13.

Next, description will be made below as to a push button type tuner in accordance with the fourth embodiment of the invention with reference to FIGS. 13 to 18. This embodiment consists in that a variable tuning device 74 is designed and constructed in the different manner from the a foregoing embodiments. In this embodiment the variable tuning device 74 is arranged so as to cover a large part of channel selecting mechanisms 11 therewith. The variable tuning device 74 is fixedly mounted by attaching its rear end part to a support surface 112 by means of a plurality of set screws 113, the support surface 112 being formed by bending the upper end part of the rear upright standing portion 111 of the support plate 15. An actuating plate 114 with armature shafts 76 of the variable tuning device 74 fixedly secured thereto is extended in the transverse direction as seen in FIG. 13 so as to cover a large part of all the channel selecting shafts 14. A support rod 115 extending at a right angle relative to the longitudinal direction of the actuating plate 114 is provided at the central area of the latter and it is inserted through the upright standing portion 116 formed by punching a part of the actuating plate 114 and the rear upright standing portion 117 of the actuating plate 114 to which the fore end of the armature shafts 76 is fixed. The foremost end of the support rod 115 is slidably supported on the fore upright standing portion 16 of the support plate 15, whereas the rear end part of the same is slidably supported on the variable tuning device 74. Both the ends of the actuating plate 114 as seen in the longitudinal direction are slidably supported on guide rods 118 extending in parallel with the support rod 115.

A locking plate 119 for holding the channel selecting shafts 14 during their rearward movement is disposed on the bottom plate 36 to extend in parallel with the latter and it is formed with elongated holes 121 at both the fore and rear ends thereof, the elongated holes 121 extending in the longitudinal direction of the locking plate 119. A pin 122 standing upright from the bottom plate 36 is loosely fitted into each of the elongated holes 121 so that the locking plate 119 is slidably displaced in the longitudinal direction. The locking plate 119 is provided with a coil spring 123 whose one end is connected to the locking plate 119 and whose other end is anchored at the bottom plate 36 whereby the locking plate is normally biased in the rightward direction as seen in FIG. 13 under the effect of the resilient force of the coil spring 123.

The locking plate 119 is formed with a plurality of engagement slots 126 each of which includes an inclined edge 124 and a stepped portion 125 located behind the inclined edge 124 which extends in the forward and rearward directiones at a certain inclination angle on the left side of the engagement slot 126 as seen in the drawing. The engagement slots 126 are located at the position opposite to the channel selecting shafts 14 so that an engagement piece 127 extending downwardly of the stopper 55 on the channel selecting shaft 14 is fitted into each of the engagement slots 126. To allow the engagement piece 127 to be engaged to the engagement slot 126 without fail, a relief slot 128 is formed on the bottom plate 36 of the support frame 15 at the position located below the engagement slot 126. Further, the channel selecting dog 51 has a storing projection 131 projecting upwardly therefrom. A return spring 132 for the actuating plate 114 is disposed on the support 115 of the variable tuning device 74 in the area between the rear upright standing portion 117 and the variable tuning device 74.

Now, it is assumed that the righthand channel selecting shaft 14 is held at the rear operative position while the engagement piece 127 is engaged to the stepped portion 125 of the engagement slot 126. When the lefthand channel selecting shaft 14 is displaced in the rearward direction together with the actuating shaft 13, the engagement piece 127 on the channel selecting shaft 14 comes in engagement to the inclined edge 124 of the engagement slot 126 and thereby the locking plate 119 is temporarily displaced in the transverse direction against the resilient force of the spring 123. During transverse movement of the locking plate 119, the righthand channel selecting shaft 14 which has been held at the rear operative position is caused to return to the initial position by allowing the engagement piece 127 to be disengaged from the stepped portion 125 and the lefthand channel selecting shaft 14 is held at the rear operative position by allowing the engagement piece 127 to be engaged to the stepped portion 127. It should be noted, however, that the arrangement made in such a manner as to slidably displace the actuating plate 114 with the variable tuning device 74 connected thereto in the forward and rearward directions in the same way as the actuating shaft 13 has a drawback which will be described below.

Now, it is assumed that the lefthand channel shaft 14 is displaced rearwardly together with the actuating shaft 13 from the operative state where the righthand channel selecting shaft 14 is held at the rear operative position and the actuating plate 114 comes in abutment against the rear edge of the storing projection 131 on the righthand channel selecting shaft 14. During the step of rearward movement, the lefthand channel selecting shaft 14 is caused to return to the initial position under the effect of the resilient force of the return spring 47. On the other hand, the actuating plate 114 is displaced forwardly under the effect of the resilient force of the return spring 132 until it abuts against the storing projection 131 on the lefthand channel selecting shaft 14. As a result, a so-called "hammering function" takes place. It is found that the hammering function takes place with the highest intensity when the one storing projection 131 is located at the rearmost position on the one channel selecting shaft 14 and the other storing projection 131 is located at the foremost position on the other channel selecting shaft 14. Thus, an appreciable amount of rotational force is produced in the thread engagement area where the channel selecting dog 51 is threadably mounted on the channel selecting shaft 51 under the influence of mechanical vibration caused due to the hammering function, resulting in a high possibility of error of channel selection and mechanical damage in the abutment area.

In view of the drawback as mentioned above, a push button type tuner in accordance with the fourth embodiment of the invention is constructed such that while one of the pair of channel selecting shafts is kept in the inoperative state, the other one is kept in the operative state and their channel selecting dogs are located at the foremost position, and an abutment portion 133 is provided at the position located between both the abutment surfaces of the storing projections on the channel selecting dogs and the abutment portion 133 is adapted to abut against the actuating plate during movement of the channel selecting dogs.

Figure 17:
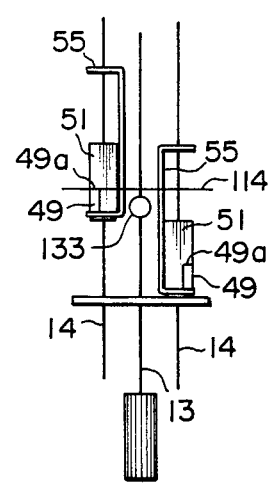
FIG. 17 is a fragmental schematic plan view of the push button type tuner, particularly illustrating the positional relation of the abutment portion in the push button type tuner in FIG. 13.

In the fourth embodiment, the abutment portion 133 is constituted by upwardly projecting the pin 33 fitted into the slit 32 on the shifting lever 25. FIG. 17 schematically illustrates the positional relation between the abutment portion 133 and the pair of channel selecting dogs 51. Specifically, the drawing illustrates that the abutment portion 133 is located possibly closest to the rear end abutment surface 49a of the storing projection 49 on the lefthand channel selecting dog 51 which has assumed the operative position where a required channel is selected by an operator.

Figure 18A:
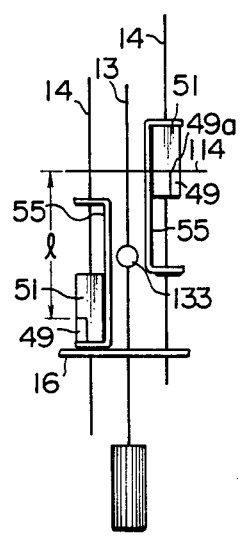
FIGS. 18a to 18d are a fragmental schematic plan view of the push button type tuner respectively, particularly illustrating operation of the abutment portion in the push button type tuner step by step.
Figure 18B:
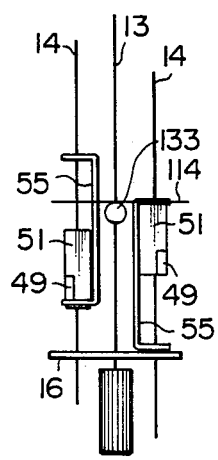

Next, the abutting function of the actuating plate 114 against the abutment portion 133 will be described below with reference to FIGS. 18a to 18d. FIG. 18a illustrates that the hammering function takes place with the highest intensity, that is, the storing projection 49 on the righthand channel selecting dog 51 is located at the rearmost position on the channel selecting shaft 14 where the actuating plate 114 abuts against the abutment surface 49a of the storing projection 49 while the storing projection 49 assumes the operative position where a required channel is selected. At this moment, the storing projection 49 on the other channel selecting dog 51 which has assumed the inoperative position where no channel is selected is located at the foremost position on the channel selecting shaft 14.

Figure 18C:
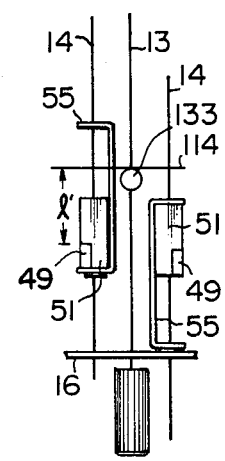
Figure 18D:
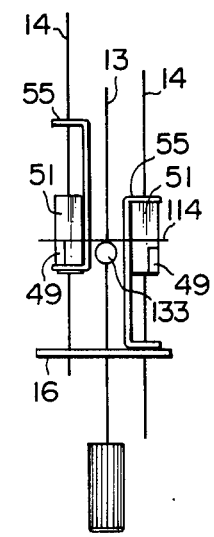

When the actuating shaft 13 is displaced rearwardly from the above-mentioned operative position, the right-hand channel selecting shaft 14 which has assumed the operative position as described above is displaced forwardly and the actuating plate 114 abuts against the abutment portion 133 before it abuts against the abutment surface 49a of the storing projection 49 which has assumed the inoperative position as described above, as illustrated in FIG. 18b. As the actuating shaft is displaced rearwardly further, the actuating plate 144 is displaced rearwardly by means of the abutment portion 133 and thereby it is pushed back at a predetermined distance, as illustrated in FIG. 18c. When rearward movement of the actuating shaft 13 is interrupted, it is then caused to return to the initial position and the actuating plate 114 is displaced forwardly until it abuts against the abutment surface 49a of the lefthand storing projection 49, as illustrated in FIG. 18d. Since the lefthand storing projection 49 is displaced forwardly together with the channel selecting shaft 14 by a certain distance at this moment, the actuating plate 114 is parted away or separated from the abutment portion 133. Thus, a distance as measured till abutment of the actuating plate 114 against the abutment surface 49a of the storing projection 49 is reduced whereby the hammering function can be damped remarkably.

Namely, when the tuner is provided with no abutment portion, the actuating plate 114 has a distance of rearward movement substantially equal to l, as illustrated in FIG. 18a. However, when it is provided with an abutment projection 133, the distance of rearward movement of the actuating plate is reduced to l', as illustrated in FIG. 18c. Further, since the resilient force of the spring 132 on the actuating plate 133 is first received by the abutment portion 133 and it is then caused to abut against the abutment surface 49a smoothly by pulling operation of an operator's finger which has pushed the push button 12, the hammering function is damped, resulting in substantially reduced occurrence of error in channel selection and mechanical damage.

While the present invention has been described above with respect to a few preferred embodiments, it should of course be understood that it should not be limited only to them but various changes or modifications may be made in any acceptable manner without departure from the spirit and scope of the invention.

What is claimed is:

1. In a push button type tuner including supporting means, tuning means mounted on said supporting means to generate a tuned frequency and being movable to a position corresponding to the tuned frequency, and a plurality of presettable channel selecting mechanisms for selectively displacing the tuning means to the position corresponding to a frequency specified for each of said channel selecting mechanisms, the improvement comprising:

each of the channel selecting mechanisms comprising a rotatable actuating member displaceable between a fore inoperative position and a rear operative position relative to the supporting means, said actuating member being normally urged toward the fore inoperative position and including a main rotatable portion and a push button which serves as a rotary knob, said push button being fixedly secured to the foremost end of the actuating member, the actuating member coacting with a pair of rotatable channel selecting members which are displaceable between the fore inoperative position and the rear operative position, said channel selecting members being so mounted on the supporting means that they are normally urged toward the fore inoperative position and each of the channel selecting members having a follower rotatable portion selectively engageable with the main rotatable portion to rotate with the latter, each of the channel selecting members having a longitudinally extending threaded portion on which is threadably mounted a channel selecting dog, said channel selecting dog being displaceable in the forward and rearward directions as the channel selecting member rotates, an engagement mechanism mounted on the actuating member so as to effect engagement of the actuating member with the channel selecting members so that the latter are alternately displaced toward the rear operative position of the actuating member at every time when a cycle of forward and rearward movements of the actuating member between the fore inoperative position and the rear operative position is achieved, the tuning means including an actuating plate engageable with the channel selecting dog on the channel selecting member which is located at the rear operative position to enable the tuning means to be adjusted by the actuating plate, and, the tuner further including a locking member having means for allowing rotation of the main rotatable portion to be transmitted to the follower rotatable portion when one of the channel selecting members is located at the rear operative position and to unlock the one channel selecting member which has assumed the rear operative position from the locked state when the other channel selecting member reaches the rear operative position.

2. A push button type tuner as defined in claim 1, wherein the main rotatable portion and the follower rotatable portion each comprise a gear.

3. A push button type tuner as defined in claim 1, wherein the diameter of the follower rotatable portion is larger than that of the main rotatable portion.

4. A push button type tuner as defined in claim 1, wherein the main rotatable portion is mounted on the actuating member so as to slidably move in the longitudinal direction and the actuating member includes biasing means for biasing the main rotatable portion toward the fore inoperative position and a limiting member for limiting the position of the main rotatable portion so as to allow rotation of the latter to be transmitted to the follower rotatable portion when the channel selecting member is located at the rear operative position.

5. A push button type tuner as defined in claim 1, wherein the follower rotatable portion is mounted on each of the channel selecting members so as to slidably move in the axial direction and the channel selecting member includes biasing means for biasing the follower rotatable portion toward the rear inoperative position and a limiting member for limiting the position of the follower rotatable portion so as to allow rotation of the main rotatable portion to be transmitted to the follower rotatable portion when the channel selecting shaft is located at the rear operative position.

6. A push button type tuner as defined in claim 1, wherein the actuating plate is disposed to move in the same direction as the direction of movement of the actuating member and it is normally urged toward the fore inoperative position.

7. A push button type tuner as defined in claim 1, wherein both the end parts of the actuating plate extending in parallel with the direction of movement of the latter are slidably mounted on the supporting means and the central part of the same includes a holding member which extends in the direction of movement of the actuating plate and of which both ends are slidably supported on the supporting means, said holding member being fixedly secured to the actuating plate.

8. A push button type tuner as defined in claim 1, wherein the engagement mechanism includes a supporting member supported on the actuating member to move in operative association with the actuating member but not responsive to rotation of the actuating member, a shifting lever having a central part turnably mounted on the supporting member, forward moving engagement members mounted on the pair of channel selecting members to come in engagement with the shifting lever during movement of the actuating member toward the rear operative position so that the channel selecting member is displaced toward the rear operative position, and a shifting engagement member mounted on the pair of channel selecting members to come in engagement with the shifting lever in the event of return movement of the actating member toward the fore inoperative position so that the shifting lever is shifted to the other channel selecting member.

9. A push button type tuner as defined in claim 8, wherein the shifting lever includes a first portion at the one end configured to come in engagement with the one forward movement engagement member on one of the pair of channel selecting members, a second portion at the same end thereof configured to come in engagement with the other forward movement engagement member on the other one of the same, and a resilient biasing member having one end fixedly secured to the supporting member and another end connected to the other end of the shifting lever whereby the shifting lever is selectively held in the shifted state where it is shifted to one of both the sides under the effect of the resilient force of the resilient biasing member.

10. A push button type tuner as defined in claim 1, wherein the channel selecting member includes a locking member at the rear end thereof of which fore end part has a tapered configuration and which includes an engagement portion at the position located in the proximity of the rear end of the channel selecting member, said locking member including a resilient member for biasing the locking member in the one direction under the effect of the resilient force of the resilient member and a plurality of locking holes located at the position determined corresponding to the locking member on the channel selecting member, so that while the one channel selecting member is held at the rear operative position with the engagement portion of the locking member on the one channel selecting shaft being engaged in the locking hole, the locking member on the other channel selecting member is displaced against the resilient force of the resilient member to be engaged in the corresponding locking hole and thereby the locking member on the one channel selecting member is released from the locked state.

11. A push button type tuner as defined in claim 1, wherein the channel selecting member includes an engagement projection which is movable together with the channel selecting member, and the locking member includes a resilient member for biasing the locking member in the one direction under the effect of the resilient force of the resilient member and a locking hole formed at the position corresponding to the engagement projection on each of the channel selecting members, said locking hole including an inclined edge for displacing the locking member against the resilient force of the resilient member by allowing the engagement projection to come in engagement with the inclined edge as the channel selecting member is displaced toward the rear operative position and a stepped portion at which the channel selecting member is kept locked at the rear operative position thereof.

12. A push button type tuner as defined in claim 1, wherein the actuating plate extends in the direction at a right angle relative to the direction of movement of the actuating member and is mounted on the supporting means to move in the first-mentioned direction, and the pair of channel selecting dogs on the channel selecting members are located alternately offset in the direction of forward and rearward movement of the actuating member relative to the pair of channel selecting dogs on the adjacent channel selecting members so that inclined cam edges for displacing the actuating plate in the first-mentioned direction while they are engaged with the channel selecting members are located in the zigzag-shaped configuration as seen in the direction of movement of the actuating members.

13. A push button type tuner as defined in claim 12, wherein the actuating plate is mounted on the supporting means to move in the first-mentioned direction relative to the supporting means with the aid of a turning bar having one end pivotally connected to the supporting means and another end pivotally connected to the actuating plate, and the actuating plate is normally urged in the one direction under the effect of the resilient force of a resilient member so that the turning bar is caused to tilt toward the direction of inclination of the inclined cam edge when the channel selecting dog is not engaged with the inclined cam edge.

14. A push button type tuner as defined in claim 1, wherein the actuating plate is located on the channel selecting mechanisms at a predetermined distance kept therebetween and is supported on the supporting means so as to move in the same direction as the direction of movement of the channel selecting dogs, and the actuating plate is normally urged toward the fore inoperative position under the effect of the resilient force of a resilient member.

15. A push button type tuner as defined in claim 1, wherein the actuating plate is located on the channel engagement mechansims at a predetermined distance kept therebetween and is supported on the supporting means so as to move in the same direction as the direction of movement of the channel selecting dogs, and the actuating plate is normally urged toward the fore inoperative position under the effect of the resilient force of a resilient member. And wherein the actuating shaft includes an abutment piece located at the intermediate position between both the channel selecting dogs when the latter assume their extreme position in such a manner that the channel selecting dog on the one channel selecting shaft is located at the fore inoperative position and the same on the other channel selecting shaft is located at the rear operative position whereby the actuating plate abuts against the abutment piece during movement thereof.

16. A push button type tuner as defined in claim 15, wherein the abutment piece is fixedly secured to the engagement mechanism so as to serve also as a pin by means of which the extent of shifting movement of the engagement mechanism is limited.

* * * * *